(12) United States Patent
Kartal

(10) Patent No.: US 9,112,494 B2
(45) Date of Patent: Aug. 18, 2015

(54) CHARGE PUMP DRIVEN ELECTRONIC SWITCH WITH RAPID TURN OFF

(75) Inventor: Veli Kartal, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 899 days.

(21) Appl. No.: 13/192,905

(22) Filed: Jul. 28, 2011

(65) Prior Publication Data

US 2013/0026829 A1  Jan. 31, 2013

(51) Int. Cl.
*H03K 17/693* (2006.01)
*H03K 17/06* (2006.01)

(52) U.S. Cl.
CPC ........ *H03K 17/063* (2013.01); *H03K 2017/066* (2013.01); *H03K 2217/0063* (2013.01)

(58) Field of Classification Search
None
See application file for complete search history.

(56) References Cited

U.S. PATENT DOCUMENTS

| | | | | |
|---|---|---|---|---|
| 5,187,632 A | * | 2/1993 | Blessing | 361/103 |
| 5,592,117 A | * | 1/1997 | Nadd | 327/374 |
| 5,866,957 A | * | 2/1999 | Baba et al. | 307/113 |
| 7,248,078 B2 | * | 7/2007 | Mitsuda | 326/83 |
| 7,606,015 B2 | * | 10/2009 | Tanabe | 361/93.1 |
| 2006/0050461 A1 | * | 3/2006 | Bolz et al. | 361/103 |
| 2007/0146951 A1 | * | 6/2007 | Takahashi et al. | 361/93.1 |
| 2009/0200874 A1 | * | 8/2009 | Takai et al. | 307/109 |
| 2009/0302927 A1 | | 12/2009 | Doffin | |

FOREIGN PATENT DOCUMENTS

| | | |
|---|---|---|
| CN | 1738202 A | 2/2006 |
| CN | 101473538 A | 7/2009 |
| DE | 19950022 A1 | 4/2001 |
| EP | 1550215 B1 | 7/2005 |
| GB | 2356755 A * | 5/2001 |

* cited by examiner

*Primary Examiner* — Rexford Barnie
*Assistant Examiner* — David Shiao
(74) *Attorney, Agent, or Firm* — Murphy, Bilak & Homiller, PLLC

(57) ABSTRACT

An electronic circuit includes an electronic switch with a control terminal and a load path between a first and a second load terminal, and a drive circuit with an output terminal coupled to the control terminal of the electronic switch. The drive circuit includes a first input terminal and a second input terminal, a first drive unit coupled between the first input terminal and the output terminal and including a charge pump and drive unit, and a second drive unit coupled between the second input terminal and the output terminal and including a further electronic switch coupled between the output terminal and a terminal for a reference potential.

28 Claims, 5 Drawing Sheets

CHARGE PUMP DRIVEN ELECTRONIC SWITCH WITH RAPID TURN OFF

TECHNICAL FIELD

The present application relates to an electronic circuit with an electronic switch and with a drive circuit for the electronic switch.

BACKGROUND

Electronic switches, such as MOSFETs (metal oxide semiconductor field effect transistors) or IGBTs (insulated gate bipolar transistors), are widely used as switches in a variety of different electric or electronic applications.

Automotive on-board power supply systems in modern cars include at least two power supply sub-systems each having a battery. A first sub-system includes the starter, while a second sub-system includes other electric loads, such as lamps, a radio, a car navigation system, window lifters, seat adjustments, etc. The first sub-system may further include a generator for charging or re-charging the batteries in both sub-systems. The two sub-system are connected via an electronic switch so as to balance the voltage in the two sub-systems and so as to allow the generator to charge the batteries in both sub-systems.

When the starter is actuated in such a power supply system it draws a huge current which may cause the supply voltage of the battery in the first sub-system to drop. In order to prevent a voltage drop of the supply voltage in the second sub-system, the electronic switch can be opened in those time periods in which the starter is actuated. When the switch is open, the battery in the second circuit supplies the loads of the second sub-system, so that actuating the starter does not cause these loads to be deactivated or switched off.

The electronic switch used to connected or disconnect the two subsystem may be implemented as a high-side switch that is driven using a charge pump, where the switch is switched on when the charge pump is activated by a control signal and is switched off when the charge pump is deactivated by the control signal. However, high-side switches that are driven using a charge pump have a relatively long switching delay. The "switching delay" is the time delay between the time of applying the control signal to the charge pump and the time of switching off the electronic switch. This delay may be in the range of several 10 ms (microseconds).

The electronic switch may be switched off each time an operating state is detected that indicates that the voltage in the second system is about to drop. However, due to the delay time, the voltage may significantly drop between the time at which this operating state is detected and the time at which the electronic switch interrupts the connection between the two sub-systems.

There is, therefore, a need to provide an electronic circuit with a switch, in particular with a high-side switch, in which the switch can be switched off with a low delay time.

SUMMARY

A first aspect relates to an electronic circuit that includes an electronic switch with a control terminal and a load path between a first and a second load terminal, and a drive circuit with an output terminal coupled to the control terminal of the electronic switch. The drive circuit includes a first input terminal and a second input terminal, a first drive unit coupled between the first input terminal and the output terminal and including a charge pump, and a second drive unit coupled between the second input terminal and the output terminal. The second drive circuit further includes a further electronic switch coupled between the output terminal and a terminal for a reference potential.

A second aspect relates to an automotive power supply system. The system includes a first power supply system with a first battery, a second power supply system with a second battery, and an electronic switch with a control terminal and a load path coupled between a first and a second load terminal, with the load path being connected between the first and second power supply sub-systems. The system further includes a drive circuit with an output terminal coupled to the control terminal of the electronic switch. The drive circuit further includes a first input terminal and a second input terminal, a first drive unit coupled between the first input terminal and the output terminal and including a charge pump, and a second drive unit coupled between the second input terminal and the output terminal. The second drive unit further includes a further electronic switch coupled between the output terminal and a terminal for a reference potential.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

For illustration purposes, embodiments of the present invention will be explained in detail hereinbelow. These embodiments relate to an electronic circuit with an electronic switch and a drive circuit coupled to a control terminal of the electronic switch. This electronic circuit will be explained in a specific context, namely in context with an automotive power supply system in which the electronic switch is connected between two sub-systems of the automotive power supply system. However, this is only an example. The electronic circuit may be used in connection with any other circuit application in which an electronic switch is required, as well.

Figure 1:
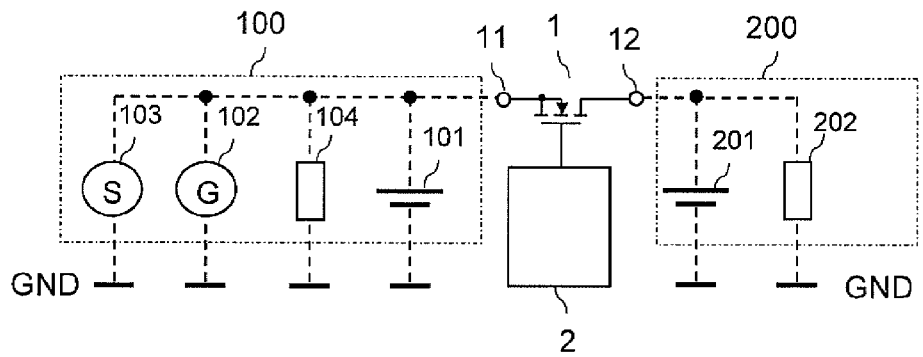
FIG. 1 schematically illustrates an electronic circuit with an electronic switch and a drive circuit coupled to a control terminal of the electronic switch.

FIG. 1 illustrates an electronic circuit with an electronic switch 1 having a control terminal and having a load path between a first load terminal and a second load terminal, and with a drive circuit 2 coupled to the control terminal of the electronic switch 1. In the embodiment illustrated in FIG. 1, the electronic switch 1 is implemented as a MOSFET, specifically as an n-type enhancement MOSFET. The MOSFET includes a gate terminal as a control terminal, a drain terminal as a first load terminal, and a source terminal as a second load terminal. It should be noted that implementing the electronic switch 1 as an n-type enhancement MOSFET is only an example. The electronic switch 1 could also be implemented as any other type of MOSFET, such as a p-type MOSFET, or the electronic switch 1 could be implemented as an IGBT.

As illustrated in FIG. 1, the electronic circuit with the electronic switch 1 and the drive circuit 2 may employed to connect or disconnect two power supply sub-systems 100, 200 in an automotive power supply system. These sub-systems 100, 200 are illustrated in dashed lines in FIG. 1. Each of these sub-systems 100, 200 includes a battery 101, 201, in particular a rechargeable battery. Besides the batteries 101, 201 each of the sub-systems includes at least one electric load. In the embodiment illustrated in FIG. 1, the first sub-system 100 includes a starter 103 as a load, where the first sub-system 100 may include at least one additional load 104, each connected in parallel with the first battery 101. The first sub-system 100 further includes a generator 102 for recharging the battery 101, with the generator 102 being connected in parallel with the first battery 101. The at least one load 202 of the second sub-system 200 is connected in parallel with the second battery 201. The at least one load 202 of the second sub-system 200 is, for example, a radio, a window lifter, a seat adjustment, a car navigation system, a lamp, or the like.

In order to charge or recharge the second battery 201 it is desirable to have the second battery 201 connected to the generator 102 in the first sub-system 100. However, there may be operation states of the automotive power supply system in which it is desirable to interrupt the connection between the first and the second sub-system 100, 200. When, for example, the starter 103 is actuated, the starter 103 draws a high current from the first battery 101. This high current drawn from the first battery 101 may result in a decrease of the supply voltage provided by the first battery 101. When, at this time, the first and second sub-systems 100, 200 are connected, a high current would also be drawn from the second battery 201, resulting in a decrease of the supply voltage provided by the second battery 201, and possibly resulting in an interrupt of the operation of the at least one load 202 connected to the second battery 201. Thus, when the starter 103 is actuated, it may be desirable to disconnect the two sub-systems 100, 200 in order to keep the voltage supply in the second sub-system 200 stable.

For connecting and disconnecting the first and second sub-systems 100, 200 the load path of the electronic switch 1 is connected between a first terminal 11 of the first power supply sub-system 100 and a second terminal 12 of the second power supply sub-system 200. These first and second terminals 11, 12 are terminals at which a positive supply potential of the first battery 101 and the second battery 201, respectively, are provided. The first and second sub-systems 100, 200 may have a common reference potential, such as ground GND.

When the starter 103 is actuated, the supply voltage provided by both batteries 101, 201 may rapidly decrease. Thus, it is desirable to switch off the electronic switch 1 rapidly before the supply voltage of the second battery 201 may have significantly decreased.

Figure 2:
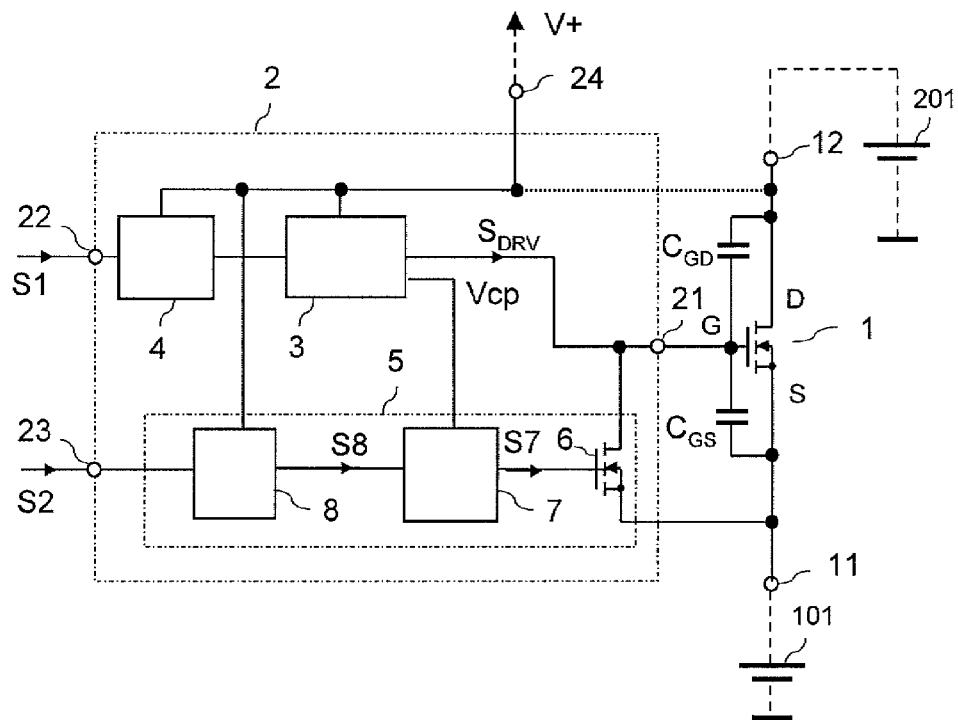
FIG. 2 illustrates a first embodiment of the drive circuit including a first drive unit and a second drive unit.

A first embodiment of a drive circuit 2 configured to switch the electronic switch 1 on and off is illustrated in FIG. 2. This drive circuit 2 illustrated in FIG. 2 is, in particular, configured to switch the electronic switch 1 rapidly off. For a better understanding, the electronic switch 1 and the batteries 101, 201 of the power supply sub-systems are also illustrated in FIG. 2. The electronic switch 1 is, again, implemented as an n-type MOSFET having a gate terminal G as a control terminal, a drain terminal D as a first load terminal, and a source terminal S as a second load terminal.

In order to ease understanding, the first and second batteries 101, 201 are also illustrated in FIG. 2. However, loads and/or generators that may be connected to these batteries 101, 201 are not illustrated in FIG. 2.

Referring to FIG. 2, the drive circuit 2 includes an output terminal 21 connected to the control terminal G of the electronic switch 1, and first and second input terminals 22, 23. The drive circuit 2 further includes a first drive unit coupled between the first input terminal 22 and the output terminal 21 and a second drive unit 5, which may also be referred to as a fast switching unit, connected between the second input terminal 23 and the output terminal 21.

When employed as an electronic switch between power supply sub-systems in a automotive power supply system, the electronic switch 1 is connected as a high-side switch, where the electrical potential at the first load terminal (source terminal S) is the first supply potential provided by the first battery 101. An n-type MOSFET, as illustrated in FIG. 2, is a voltage controlled device that requires a drive potential at the gate terminal G to be higher than the source or drain potential in order to be switched on. The first drive unit, which may also be referred to as a normal switching unit, includes a charge pump and drive unit 3 coupled to the output terminal 21 of the drive circuit 2, and a control circuit 4 connected between the first input terminal 22 of the drive circuit 2 and an input of the charge pump and drive unit 3. The control circuit 4 is configured to activate or deactivate the charge pump and drive unit 3 dependent on a signal S1 received at the first input terminal 22. The charge pump and drive unit 3 receives a supply voltage V+ at a supply terminal 24. This supply terminal 24 may be connected to the drain terminal D of the MOSFET 1, as illustrated in dotted lines in FIG. 2. In this case, the supply potential at the supply terminal 24 corresponds to a supply potential available at the drain terminal D of the MOSFET 1. However, it is possible for the supply potential V+ at the supply terminal 24 to be independent of the potential at the drain terminal D.

The charge pump and drive unit 3 includes a drive output and a supply output and is configured to generate a drive signal $S_{DRV}$ at the drive output and a charge pump potential Vcp at the supply output, where the charge pump potential Vcp is higher than the supply potential V+ when the charge pump and drive unit 3 is activated. The drive output of the charge pump and drive unit 3 is coupled to the output terminal 21 and via the output terminal to the gate terminal 1 of the MOSFET 1.

The MOSFET 1 has an internal gate-source capacitance $C_{GS}$ between the gate terminal G and the source terminal S and an internal gate-drain capacitance $C_{GD}$ connected between the gate terminal G and the drain terminal D. These internal capacitances $C_{GS}$, $C_{GD}$ are also illustrated in FIG. 2. The gate-source capacitance $C_{GS}$ and the gate-drain capacitance $C_{GD}$ are charged by the drive signal $S_{DRV}$ provided by the charge pump and drive unit 3 when the charge pump and drive unit 3 is activated, so as to switch the MOSFET 1 on. When the charge pump and drive unit 3 is deactivated, the drive signal $S_{DRV}$ discharges the gate-source capacitance $C_{GS}$ and the gate-drain capacitance $C_{GD}$ so as to switch the MOSFET 1 off. The charge pump and drive unit 3 is configured to generate the drive signal $S_{DRV}$ with a defined slew rate when the charge pump and drive unit 3 is activated and deactivated in order to achieve a defined switching operation of the MOSFET 1 and in order to control EMI (Electromagnetic Interferences). In order to reduce EMI, the MOSFET 1 is usually switched on and off slower than it could be switched on and off.

In the drive circuit according to FIG. 2, both the charge pump potential Vcp and the drive signal $S_{DRV}$ are generated based on the signal S1 received at the first input terminal 22. However, the drive signal $S_{DRV}$ may be generated such that it reacts faster on changes of the input signal S1, in particular when the input signal S1 indicates that the charge pump and drive unit 3 is to be deactivated, so that the MOSFET 1 is switched off. While the charge pump potential Vcp may only slowly decrease after a deactivation of the charge pump and drive unit 3, the drive signal $S_{DRV}$ may faster change its signal level in order to switch the MOSFET 1 off.

Referring to the explanations provided before, the drive signal $S_{DRV}$ may provide for a controlled, relatively slow switching of the MOSFET in order to avoid (or at least reduce) EMI. Relatively slow switching operations, however, result in a delay between the time when the signal S1 at the first terminal 22 assumes an off-level, which is a level at which the MOSFET 1 is to be switched off, and the time at which the MOSFET 1 switches off. In order to reduce this delay time, the drive circuit 2 includes the second drive unit 5. The second drive unit 5 includes a further electronic switch 6 with a load path and a control terminal. The load path of the further electronic switch 6 is connected between the gate terminal G, via the output terminal 21 of the drive circuit 2, and a terminal for a reference potential. This terminal for the reference potential is the source terminal S in the embodiment illustrated in FIG. 2. The further electronic switch 6 is configured to rapidly discharge the internal capacitances $C_{GS}$, $C_{GD}$ of the MOSFET 1 dependent on a second drive or control signal S2 received at the second input terminal 23, where the further electronic switch 6 discharges the capacitances $C_{GS}$, $C_{GD}$ each time it is switched on (in an on-state). As illustrated in FIG. 2, the further electronic switch 6 may be implemented as a MOSFET, specifically as an n-type enhancement MOSFET. However, this is only an example. Any other type of electronic switch may be used as well to implement the further electronic switch 6.

The second drive unit 5 further includes a second control unit 8 connected to the second input terminal 23, and a level shifter 7 connected between the second control circuit 8 and the control terminal of the further electronic switch 6. The second control circuit 8 is configured to generate a second control signal S8 from the second input S2, where the second control signal S8 indicates whether the further electronic switch 6 is to be switched on or off. The level shifter 7 is configured to generate a level-shifted version of the second control signal S8 as a level shifter output signal S7, wherein this output signal S7 is suitable to switch the electronic switch 6 on and off dependent on the signal level. The level shifter 7 receives a supply voltage. According to one embodiment, the supply voltage of the level shifter 7 is the charge pump voltage Vcp provided by the charge pump and drive unit 3.

Figure 3:
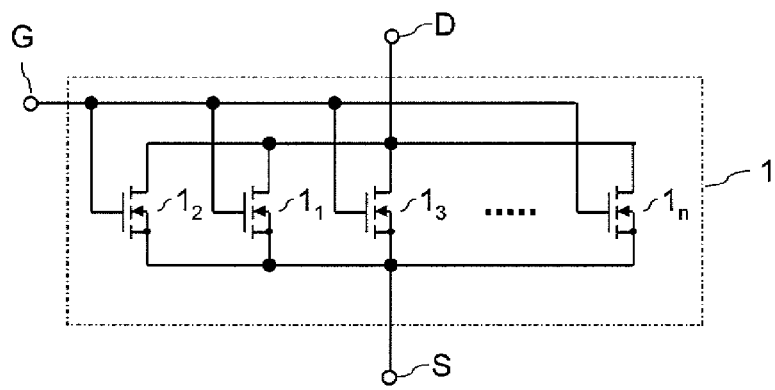
FIG. 3 illustrates a first embodiment of the electronic switch including a plurality of electronic switches connected in parallel.

While in FIGS. 1 and 2 the circuit symbol of only one MOSFET is illustrated that represents the electronic switch 1, the electronic switch 1 may include a plurality of MOSFETs having their load paths connected in parallel and having their gate terminals connected to a common gate or control terminal. An electronic switch 1 including a plurality of n MOSFETs $1_1$, $1_2$, $1_3$, $1_n$ is illustrated in FIG. 3. These MOSFETs $1_1$, $1_2$, $1_3$, $1_n$ have their load paths connected in parallel so as to form a common drain terminal D and a common source terminal S, and have their gate terminals electrically connected with each other so as to form a common gate terminal G. By connecting a plurality of MOSFETs in parallel, the current bearing capability of the electronic switch 1 can be increased. The number n of MOSFETs connected in parallel is dependent on the required current bearing capability of the electronic switch 1, and is dependent on the current bearing capability of the individual MOSFETs. According to one embodiment, the required current bearing capability of the electronic switch 1 is up to 2000 A and between n=6 and n=10 MOSFETs are connected in parallel.

In the electronic circuit of FIG. 2, the electronic switch 1 can be switched on and off in a conventional manner dependent on the first input signal S1 and the electronic switch 1 can be rapidly switched off dependent on the second input signal S2. According to one embodiment, the first and second signals S1, S2 are generated such that when the second input signal S2 assumes an off-level indicating that the MOSFET 1 is to be rapidly switched off, the first input signal S1 assumes an on-level indicating that the MOSFET 1 is to be switched on. In this case, the MOSFET 1 is switched off through the electronic switch 6, but the charge pump and drive unit 3 provides a drive voltage Vcp that is sufficient to supply the level shifter 7 that drives the electronic switch 6.

Embodiments of the first and second control circuits 4, 8 and of the charge pump and drive unit 3 are explained in further detail with reference to FIG. 4. In the drive circuit 2 of FIG. 4, the first and second control circuits 4, 8 each include a series circuit with at least one Zener diode or Avalanche diode 41, 81 and a current source 42, 82. The series circuit of the first control circuit 4 is connected between the supply terminal 24 and the first input terminal 22, and the series circuit of the second control circuit 8 is connected between the supply terminal 24 and the second input terminal 23. The control signal S4 provided by the first control circuit 4 is an electrical potential at a terminal common to the diode 41 and the current source 42, where the diode 41 is connected between the supply terminal 24 and the current source 42. The second control signal S8 of the second control circuit 8 is the electrical potential at a terminal common to the diode 81 and the current source 82, where the diode 81 is connected between the current source 82 and supply terminal 24. Dependent on the first input signal S1, the first control signal S4 either corresponds to the supply potential V+ or corresponds to the supply potential V+ minus an Avalanche voltage or breakthrough voltage of the diode 41. Equivalently, the second control signal S8 dependent on the second input signal 82 either corresponds to the supply potential V+ or to the supply potential V+ minus an Avalanche voltage or breakthrough voltage of the diode 81. Although in FIG. 4 only one Zener diode 41, 81 is illustrated each of the series circuits may include a plurality of Zener diodes or Avalanche diodes connected in series. The number of diodes connected in parallel is dependent on the desired breakthrough voltage or Avalanche voltage.

Figure 4:
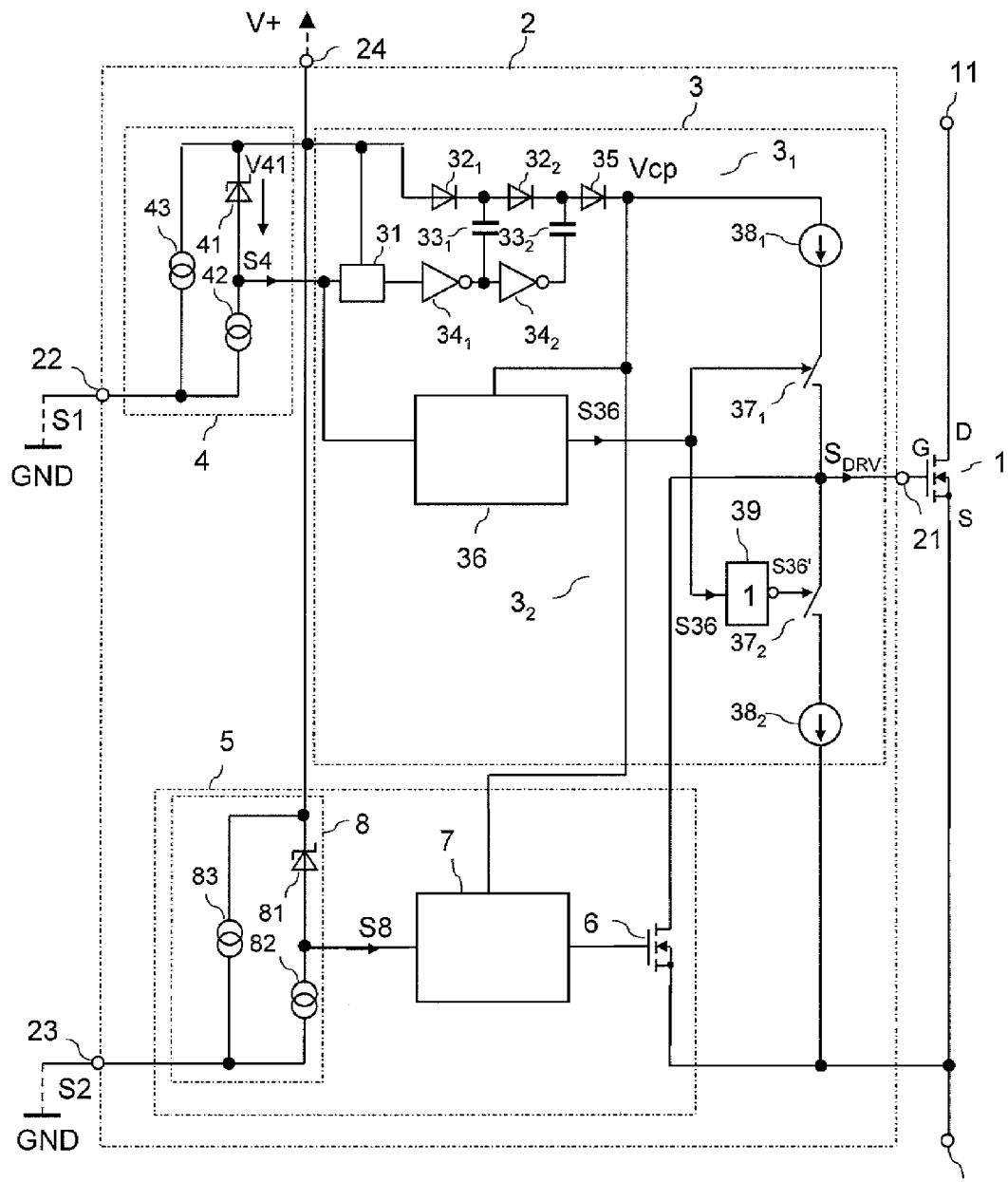
FIG. 4 illustrates circuit blocks of the first and second drive units in greater detail.

Referring to FIG. 4, further current sources 43, 83 are connected in parallel with each of the series circuits with the Zener diode 41, 81 and the current source 42, 82. These further current sources 43, 83 act as pull-up current sources that pull the electrical potentials at the first and second input terminals 22, 23 to a high potential, that may correspond to the supply potential V+, when the input terminals 22, 23 are floating.

The charge pump and drive unit 3 includes a charge pump $3_1$ that generates the charge pump potential Vcp from the supply potential V+ and a driver $3_2$ that generates the drive signal $S_{DRV}$, where the driver $3_2$ receives the control signal S4 and the charge pump potential Vcp.

The charge pump $3_1$ includes an oscillator 31 having supply terminals connected between the supply terminal 24 and the output of the control circuit 4. The oscillator 31 is activated each time a voltage V41 across the diode 41 is higher than a required supply voltage of the oscillator 31, which is each time a voltage V41 across the diode reaches the Avalanche or breakthrough voltage of the diode 41. The oscillator 31 further includes an output at which an oscillating output signal is provided when the oscillator 31 is activated. The charge pump and drive unit 3 further includes at least two charge pump stages each including a rectifier element $32_1$, $32_2$, such as a diode, and a capacitor $33_1$, $33_2$, where the rectifier element and a capacitor of each stage are connected in series. The first charge pump stage $32_1$, $33_1$ is connected between the supply terminal 24 and the output of the oscillator 31, and the second charge pump stage $32_2$, $33_2$ is connected between a circuit node common to the rectifier element $32_1$ and a capacitor $33_1$ of the first stage and the output of an inverter 34, where an input of the inverter 34 is connected to the output of the oscillator 31. A circuit node common to the rectifier element $32_2$ and the capacitor $33_2$ of the second stage is connected to the output 21 of the drive circuit 20 via a further rectifier element 35, such as a diode. The charge pump $3_1$ of the charge pump and drive unit 3 illustrated in FIG. 4 is a conventional charge pump. It should be noted in this connection that instead of the charge pump illustrated in FIG. 4 any other type of charge pump may be implemented in the drive circuit 2.

The charge pump $3_1$ of FIG. 4 is activated each time the current source 42 draws a current through the diode 41 which causes the diode 41 to breakthrough. In this case, a voltage drop across the diode 41 is sufficient for activating the oscillator 31. The current source 42 draws a current through the diode 41 each time the electrical potential at the first input terminal 22 is lower than the supply potential V+ at the supply terminal 24 minus the breakthrough voltage of the diode 41. According to one embodiment, the first input terminal 22 is coupled to ground GND, which is the reference potential common to the first and second power supply sub-systems, in order to activate the charge pump so that the charge pump $3_1$ provides a charge pump potential Vcp that is higher than the supply potential V+ (which may correspond to the drain potential of the MOSFET) and in order to switch the MOSFET 1 on. In order to deactivate the charge pump and drive unit 3 and in order to switch the MOSFET 1 off, an electrical connection between the first input terminal 22 and ground GND potential may be interrupted so as to allow the potential at the first input terminal 22 to float. In this case, the current through the diode 41 is interrupted, and the voltage V41 across the diode 41 decreases to zero so as to deactivate the oscillator 31.

The driver $3_2$ of the charge pump and drive unit 3 includes a half bridge circuit with a high-side switch $37_1$ and a low-side switch $37_2$, where the high-side switch $37_1$ is connected between the supply terminal of the charge pump and an output of the half-bridge, while the low-side switch $37_2$ is connected between the output of the half-bridge and the second load terminal (source terminal) S of the MOSFET. The output of the half-bridge, at which the drive signal $S_{DRV}$ is available, is coupled to the output 21 of the drive circuit 2. The high-side switch $37_1$ and the load-side switch $37_2$ are only schematically illustrated in FIG. 4. These switches $37_1$, $37_2$ can be implemented as conventional electronic switches, such as MOSFETs, IGBTs, or BJTs (bipolar junction transistors). The switches $37_1$, $37_2$ are switched on and off complementary and dependent on the control signal S4. A level further shifter 36, that receives the charge pump potential Vcp as a supply potential, generates a level shifted control signal S36 from the control signal S4. One of the half-bridge switches $37_4$, $37_2$, namely the high-side switch $37_1$ in the present embodiment, receives the level shifted control signal S36 at a control terminal, while the other one of the half-bridge switches $37_1$, $37_2$, namely the low-side switch $37_2$ in the present embodiment, receives an inverted level shifted control signal S36' at a control terminal. An inverter 39 generates the inverted level shifted control signal S36' from the level shifted control signal S36.

In the driver $3_2$ of FIG. 4, the MOSFET 1 is switched on each time, the high-side switch $37_1$ is switched on dependent on the control signal S4, and the MOSFET 1 is switched off each time, the low-side switch $37_2$ is switched on dependent on the control signal S4. Switching on the MOSFET 1 involves charging the gate-source capacitance and the gate-drain capacitance (not illustrated in FIG. 4) and switching the MOSFET 1 off involves discharging the gate-source capacitance and the gate-drain capacitance. The rate at which the gate-source capacitance is charged and discharged and, therefore, the switching speed of the MOSFET is defined by first and second current sources $38_1$, $38_2$ connected in series with the high-side switch $37_1$ and the low-side switch $37_2$, respectively.

The driver $3_2$ with the half-bridge $37_1$, $37_2$ and the current sources $37_1$, $37_2$ illustrated in FIG. 4 is a conventional driver for switching a MOSFET dependent on a control signal, such as the level shifted control signal S36 of FIG. 4. Thus, instead of the driver $3_2$ illustrated in FIG. 4 any other conventional driver may be employed as well.

The drive signal $S_{DRV}$ may change with a slow delay time when the signal level of the control signal S4 changes from an activation level, at which the charge pump $3_1$ is to be activated and the MOSFET 1 is to be switched on, to a deactivation level, at which the charge pump $3_1$ is to be deactivated and the MOSFET 1 is to be switched off. The switching speed at switching off the MOSFET 1 is mainly governed by the current sources $38_1$, $38_2$. The charge pump potential Vcp, however, may only slowly decrease when the charge pump $3_1$ is deactivated, because a decrease of the charge pump potential Vcp requires discharging internal capacitances of the charge pump $3_1$, such as capacitances $33_1$, $33_2$.

In the drive circuit of FIG. 2, the further electronic switch 6 is switched on each time the second control signal S8 equals the supply potential V+ minus the breakthrough voltage of the diode 81, while the electronic switch 6 is switched off, when the second control signal S8 equals the supply potential V+. A second control signal S8 being equivalent to the supply potential V+ minus the breakthrough voltage of the diode 81 can be obtained by connecting the second input terminal 23 to ground GND potential, while a second control signal S8 being equivalent to the supply potential V+ can be obtained when the second input terminal 23 is allowed to be floating. However, this is only an example. It is also possible to generate the second control signal S8 such that it switches the second switch 6 on when the second input signal S2 has a high signal level, and to switch the second switch 6 off when the second input terminal 23 is floating. According to a further embodiment, the second input signal S2 may assume a low signal level, such as ground GND level, and a high signal level, such as a 5V level, wherein the second electronic switch 6 is switched on when the second input signal S2 assumes one of these low and high levels, and wherein the second electronic switch 6 is switched off when the second input signal S2 assumes the other one of these low and high levels.

In the electronic circuits explained with reference to FIGS. 2 to 4, the further electronic switch 6 is switched on, in order to rapidly switch the electronic switch 1 off, only dependent on the second input signal S2.

Figure 5:
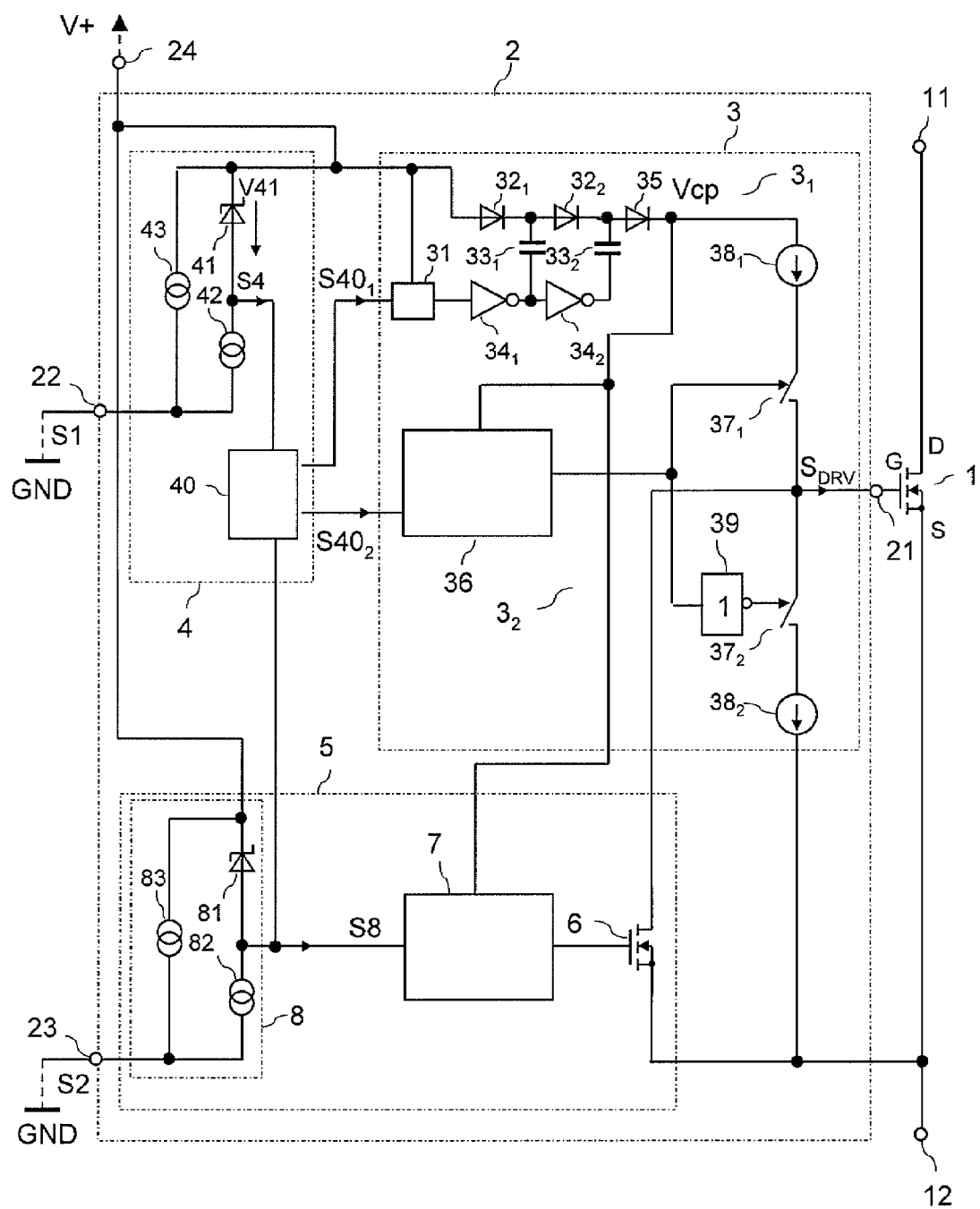
FIG. 5 illustrates a modification of the drive circuit of FIG. 4.

FIG. 5 illustrates a modification of the drive circuit 2 of FIG. 4. In the drive circuit 2 of FIG. 4 the charge pump $3_1$ of the charge pump and drive unit 3 is activated only dependent on the control signal S4 and the driver $3_2$ is only controlled dependent on the control signal. In this drive circuit increased losses may occur, when the charge pump $3_1$ is activated and the driver $3_2$ connects the output terminal 21 to the charge pump potential, in order to switch the MOSFET 1 on, while the second switch 6 is closed in order to switch the MOSFET 1 off. In this case, the current provided by the first current source 38 flows via the second electronic switch 6. However, it may be desirable to keep the charge pump $3_1$ activated when the MOSFET 1 is to be switched off through the second drive unit 5.

For this, the drive circuit 2 of FIG. 5 includes a logic circuit 40, which may be part of the control circuit 4. This logic circuit 40 receives the first control signal S4 and the second control signal S8 and generates a third control signal $S40_1$ received by the charge pump $3_1$ and a fourth control signal $S40_2$ received by the level-shifter 36. In this circuit, the charge pump $3_1$ is activated and deactivated dependent on the third control signal $S40_1$ and the drive signal $S_{DRV}$ is generated dependent on the fourth control signal $S40_2$, where both the third and fourth control signals $S40_1$, $S40_2$ are dependent on the first and second control signals S4, S8, where the first and second control signals S4, S8 in turn are dependent on the first and second input signals, respectively.

According to one embodiment, the logic circuit 40 is configured to generate the third control signal $S40_1$ such that it corresponds to the first control signal S4, so that the third control signal $S40_1$ is only dependent on the first input signal S1 and keeps the charge pump $3_1$ activated as long as the first input signal S1 has an on-level. Further, the logic circuit 40 is configured to generate the fourth control signal $S40_2$ such that this signal corresponds to the first control signal S4, when the second control signal S8 has a signal indicating that the second switch 6 is switched off. In this case, operation of the MOSFET 1 is only governed by the charge pump and drive unit 3. When, however, the second control signal S8 indicates that the second switch 6 is to be switched on in order to perform a fast switching off of the MOSFET 1, the fourth control signal $S40_2$ assumes a signal level that corresponds to the signal level when the MOSFET 1 is to be switched off, so as to prevent high losses.

According to a further embodiment, the logic circuit 40 generates the third control signal $S40_1$ such that it activates the charge pump $3_1$ or keeps the charge pump $3_1$ activated independent of the first control signal S4 whenever the second control signal S8 indicates that the second switch 6 is to be switched on. This ensures a proper operation of the level shifter 7 that drives the second switch 6 and that receives the charge pump potential.

The logic circuit 40 can be implemented using conventional logic elements, where the specific design of the logic circuit 40 is dependent on the specific signal levels of the first and second control signals S4, S8 and the desired signal levels of the third and fourth control signals $S40_1$, $S40_2$.

Figure 6:
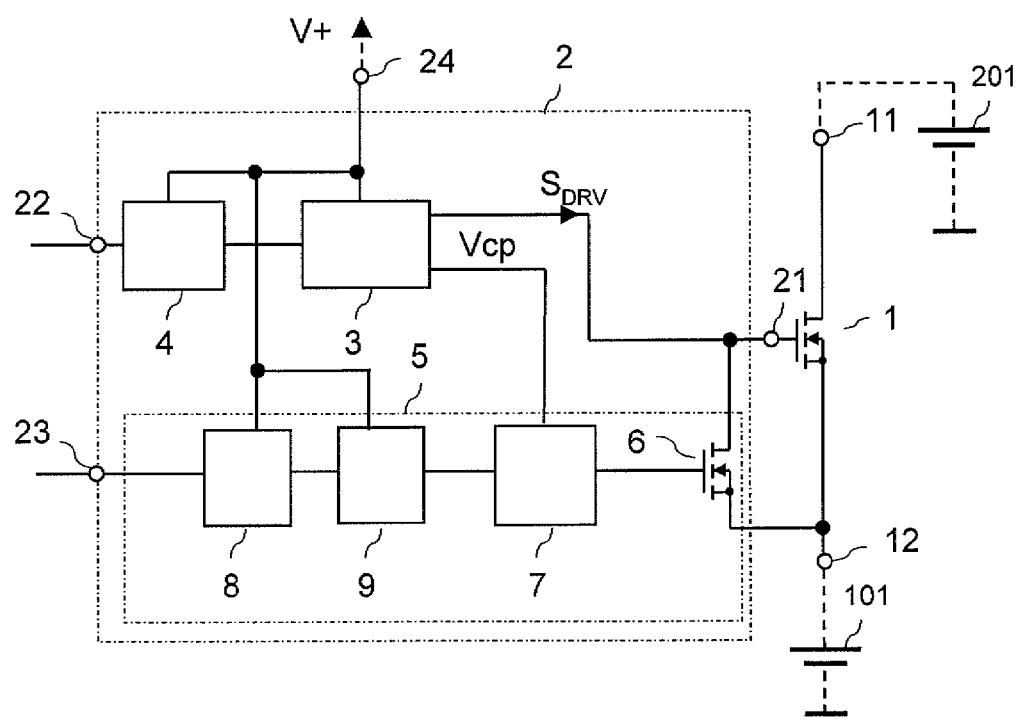
FIG. 6 illustrates a second embodiment of the drive circuit.

FIG. 6 illustrates a further embodiment of the drive circuit 2. In this drive circuit 2, the second input signal S2 received at the second input terminal 23 serves to activate or deactivate a diagnostic circuit 9 via the second control circuit 8, where the diagnostic circuit 9 via the level shifter 7 switches the further electronic switch 6 on or off. The first drive unit of the drive circuit 2 of FIG. 6 may be implemented as explained before. The diagnostic circuit 9 receives a supply potential that may correspond to the supply voltage V+ received at the supply terminal 24.

The diagnostic circuit 9 is activated and deactivated dependent on the control signal S8 provided by the second control circuit 8. This second control circuit 8 may be implemented as explained with reference to FIGS. 4 and 5. The diagnostic circuit 9 is, for example, activated when the second control signal S8 is below the second supply potential V+.

The diagnostic circuit 9 is configured to detect or evaluate an operation state of the electronic switch 1 and is configured to switch on the further electronic switch 6 via the level shifter 7 each time the operation state equals a predefined operation state, in order to switch the electronic switch 1 off. The operation state as detected or evaluated by the diagnostic circuit 9 is dependent on at least one operation parameter of the electronic switch 1, where the operation state may be dependent on several operation parameters of the electronic switch 1. According to one embodiment, at least one of the following operation parameters is evaluated by the diagnostic circuit 9: a voltage $V_{DS}$ between the first and second load terminals D, S of the electronic switch 1; a current $I_{DS}$ through the load path of the electronic switch 1; an internal temperature of the electronic switch 1. These operation parameters can be detected in a conventional and commonly known manner so that circuit means for detecting these operation parameters are not explicitly illustrated in FIG. 5. According to one embodiment, the electronic switch 1 is in the predefined operation state when at least one of the following conditions is met: the voltage $V_{DS}$ is higher than the voltage threshold value; the current $I_{DS}$ is higher than a current threshold value; and the temperature is higher than a temperature threshold.

Figure 7:
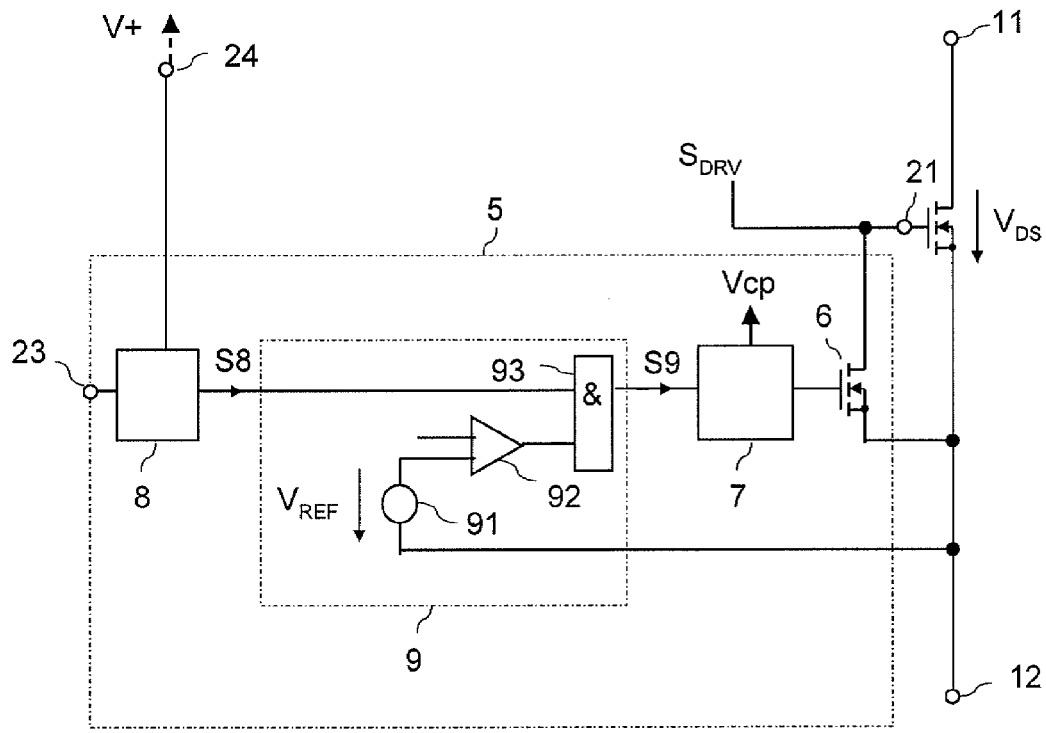
FIG. 7 illustrates the second drive unit of the drive circuit of FIG. 5 in greater detail.

FIG. 7 illustrates an embodiment of a diagnostic circuit 9 which is configured to detect the voltage $V_{DS}$ across the load path of the electronic switch 1. This diagnostic circuit 9 includes a reference voltage source 91 generating a reference voltage $V_{REF}$ representing the voltage threshold and a comparator 92. In this embodiment, a first input terminal of the comparator 92 is connected to the drain terminal D of the MOSFET 1, while the second input terminal is connected to the source terminal S via the reference voltage source 91. A comparator output signal is representative of whether the voltage $V_{DS}$ is above or below the reference voltage $V_{REF}$. A pass gate 93 at the output of the diagnostic circuit 9 allows the comparator output signal to pass to the level shifter 7 when the diagnostic circuit 9 is activated. This pass gate 93 may be implemented as a logic AND gate that receives the second control signal S8 and the comparator output signal S92 and allows the comparator output signal S92 to pass only when the control signal S8 has a signal level that is representative of an activated diagnostic circuit 9.

Figure 8:
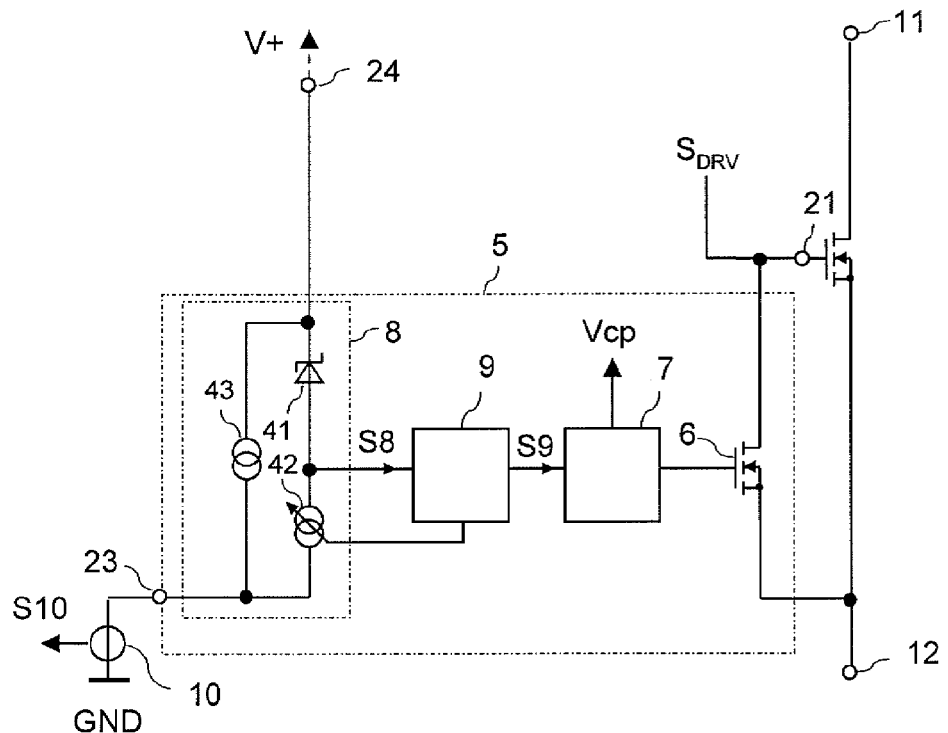
FIG. 8 illustrates a further embodiment of the second drive unit of the drive circuit of FIG. 5.

According to a further embodiment illustrated in FIG. 8, the second input terminal 23 does not only serve to apply the second input signal S2 to the drive circuit 2, but the second input terminal 23 also serves to detect the operation state of the electronic switch 1. In this case, the diagnostic circuit 9 is configured to modulate the current through the current source 42. When the second input terminal 23 is connected to ground (GND) a current that can be detected at the second input terminal 23 equals the current provided by the current source 42 plus the current of current source 43, with the current of current source 42 being modulated by the diagnostic circuit 9 dependent on the operation state as detected by the diagnostic circuit 9. The current at the output terminal can be measured using a conventional current measurement device 10 that is schematically illustrated in FIG. 7. This current measurement device provides a current measurement signal S10 that is representative of the operation state of the electronic switch 1.

According to one embodiment, the current source 42 is configured to generate two different currents, and receives the output signal S9 of the diagnostic circuit 9 as a control signal, where the current source 42 generates a first current when the diagnostic circuit 9 switches the further electronic switch 6 on and wherein the current source 42 generates a second current when the further electronic switch 6 is switched off.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit comprising an electronic switch with a control terminal and a load path between a first and a second load terminal, and a drive circuit with an output terminal coupled to the control terminal of the electronic switch, the drive circuit comprising:
   a first input terminal and a second input terminal;
   a first drive unit coupled between the first input terminal and the output terminal and comprising a charge pump and drive unit; and
   a second drive unit coupled between the second input terminal and the output terminal and comprising a further electronic switch coupled between the output terminal and a terminal for a reference potential,
   wherein the first drive unit is configured to switch the electronic switch on and off responsive to a signal received at the first input terminal,
   wherein the second drive unit is configured to switch the electronic switch off at a faster rate than the first drive unit responsive to a signal received at the second input terminal,
   wherein the charge pump remains activated and provides a drive voltage that is sufficient to supply the second drive unit when the second drive unit is switching off the electronic switch,
   wherein the charge pump is configured to be deactivated dependent on one of the signal received at the first input terminal and the signal received at the second input terminal.

2. The electronic circuit of claim 1, wherein the first drive unit further comprises a control unit connected between the first input terminal and the charge pump and drive unit.

3. The electronic circuit of claim 2, wherein the first drive unit further comprises:
   a charge pump configured to generate a charge pump potential; and
   a driver,
   wherein the control unit is configured to activate and deactivate the charge pump and drive unit dependent on at least a signal received at the first input terminal and is configured to drive the driver dependent on at least the signal at the first input.

4. The electronic circuit of claim 3, wherein the control unit is further configured to drive the driver dependent on the signal received at the second input.

5. The electronic circuit of claim 3, wherein the charge pump further comprises an oscillator configured to be activated and deactivated by the control unit.

6. The electronic circuit of claim 2, wherein the charge pump and drive unit is coupled between a terminal for a supply potential and the output terminal of the first drive unit.

7. The electronic circuit of claim 1, wherein the second drive unit further comprises:
   a control unit coupled to the second input;
   a level shifter coupled between the control unit and the further electronic switch.

8. The electronic circuit of claim 7,
   wherein the control unit is configured to provide a control signal dependent on a signal received at the second input, and
   wherein the level shifter is configured to switch the further electronic switch dependent on the control signal.

9. The electronic circuit of claim 1,
   wherein the second drive unit comprises a diagnosis circuit configured to be activated and deactivated dependent on a signal received at the second input, and configured to detect an operation state of the electronic switch, and
   wherein the second drive unit is configured to switch the further electronic switch upon detection of a predefined operation state of the electronic switch when the diagnosis circuit is activated.

10. The electronic circuit of claim 9, wherein the second drive unit further comprises:
    a control circuit coupled between the second input and the diagnosis circuit;
    a level shifter coupled between the diagnosis circuit and the further electronic switch.

11. The electronic circuit of claim 1, further comprising:
    a first power supply system connected to the first load terminal of the electronic switch;

a second power supply system connected to the second load terminal of the electronic switch.

12. The electronic circuit of claim 11, wherein the power supply systems are automotive power supply systems which each include a battery, and wherein one of the power supply systems includes a starter.

13. The electronic circuit of claim 1, wherein the terminal for the reference potential is the first load terminal of the electronic switch.

14. The electronic circuit of claim 1 wherein the electronic switch is implemented as a MOSFET.

15. An automotive power supply system, comprising:
a first power supply system comprising a first battery;
a second power supply system comprising a second battery;
an electronic switch with a control terminal and a load path between a first and a second load terminal, wherein the load path is connected between the first and second power supply systems; and
a drive circuit with an output terminal coupled to the control terminal of the electronic switch, the drive circuit comprising: a first input terminal and a second input terminal; a first drive unit coupled between the first input terminal and the output terminal and comprising a charge pump and drive unit; a second drive unit coupled between the second input terminal and the output terminal and comprising a further electronic switch coupled between the output terminal and a terminal for a reference potential,
wherein the first drive unit is configured to switch the electronic switch on and off responsive to a signal received at the first input terminal,
wherein the second drive unit is configured to switch the electronic switch off at a faster rate than the first drive unit responsive to a signal received at the second input terminal,
wherein the charge pump remains activated and provides a drive voltage that is sufficient to supply the second drive unit when the second drive unit is switching off the electronic switch,
wherein the charge pump is configured to be deactivated dependent on one of the signal received at the first input terminal and the signal received at the second input terminal.

16. The automotive power supply system of claim 15, wherein the first drive unit further comprises a control unit connected between the first input terminal and the charge pump and drive unit.

17. The automotive power supply system of claim 16, wherein the first drive unit further comprises:
a charge pump configured to generate a charge pump potential; and
a driver,
wherein the control unit is configured to activate and deactivate the charge pump and drive unit dependent on at least a signal received at the first input terminal and is configured to drive the driver dependent on at least the signal at the first input.

18. The automotive power supply system of claim 17, wherein the control unit is further configured to drive the driver dependent on the signal received at the second input.

19. The automotive power supply system of claim 18, wherein the charge pump further comprises an oscillator configured to be activated and deactivated by the control unit.

20. The automotive power supply system of claim 16, wherein the charge pump and drive unit is coupled between a terminal for a supply potential and the output terminal of the first drive unit.

21. The automotive power supply system of claim 15, wherein the second drive unit further comprises:
a control unit coupled to the second input;
a level shifter coupled between the control unit and the further electronic switch.

22. The automotive power supply system of claim 21,
wherein the control unit is configured to provide a control signal dependent on a signal received at the second input, and
wherein the level shifter is configured to switch the further electronic switch dependent on the control signal.

23. The automotive power supply system of claim 15,
wherein the second drive unit comprises a diagnosis circuit configured to be activated and deactivated dependent on a signal received at the second input, and configured to detect an operation state of the electronic switch, and
wherein the second drive unit is configured to switch the further switch on upon detection of a predefined operation state of the electronic switch when the diagnosis circuit is activated.

24. The automotive power supply system of claim 23, wherein the second drive unit further comprises:
a control circuit coupled between the second input and the diagnosis circuit;
a level shifter coupled between the diagnosis circuit and the further electronic switch.

25. The automotive power supply system of claim 15, wherein the first power supply system is connected to the first load terminal of the electronic switch and the second power supply system is connected to the second load terminal of the electronic switch.

26. The automotive power supply system of claim 15, wherein one of the power supply systems includes a starter.

27. The automotive power supply system of claim 15, wherein the terminal for the reference potential is the first toad terminal of the electronic switch.

28. The automotive power supply system of claim 15 wherein the electronic switch is implemented as a MOSFET.

* * * * *

UNITED STATES PATENT AND TRADEMARK OFFICE
CERTIFICATE OF CORRECTION

| | | |
|---|---|---|
| PATENT NO. | : 9,112,494 B2 | Page 1 of 1 |
| APPLICATION NO. | : 13/192905 | |
| DATED | : August 18, 2015 | |
| INVENTOR(S) | : Kartal | |

It is certified that error appears in the above-identified patent and that said Letters Patent is hereby corrected as shown below:

In the claims
Column 14, line 50 claim 27, change "toad terminal" to -- load terminal --

Signed and Sealed this
Ninth Day of February, 2016

Michelle K. Lee
*Director of the United States Patent and Trademark Office*